(12) United States Patent
Wang et al.

(10) Patent No.: US 10,096,994 B2
(45) Date of Patent: Oct. 9, 2018

(54) TRANSIENT-TRIGGERED DC VOLTAGE-SUSTAINED POWER-RAIL ESD CLAMP CIRCUIT

(71) Applicant: Peking University, Beijing (CN)

(72) Inventors: Yuan Wang, Beijing (CN); Guangyi Lu, Beijing (CN); Jian Cao, Beijing (CN); Xing Zhang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 382 days.

(21) Appl. No.: 14/786,517

(22) PCT Filed: Mar. 10, 2014

(86) PCT No.: PCT/CN2014/073125
§ 371 (c)(1),
(2) Date: Oct. 22, 2015

(87) PCT Pub. No.: WO2014/180184
PCT Pub. Date: Nov. 13, 2014

(65) Prior Publication Data
US 2016/0087429 A1    Mar. 24, 2016

(30) Foreign Application Priority Data

May 9, 2013  (CN) .......................... 2013 1 0169739

(51) Int. Cl.
*H02H 9/04* (2006.01)
*H01L 27/02* (2006.01)

(52) U.S. Cl.
CPC .......... *H02H 9/04* (2013.01); *H01L 27/0266* (2013.01); *H01L 27/0285* (2013.01); *H02H 9/046* (2013.01)

(58) Field of Classification Search
CPC ...... H02H 9/04; H02H 9/046; H01L 27/0266; H01L 27/0285
See application file for complete search history.

(56) References Cited

U.S. PATENT DOCUMENTS

| 6,552,886 | B1 | 4/2003 | Wu et al. | |
|---|---|---|---|---|
| 8,514,532 | B2* | 8/2013 | Worley | H02H 9/046 361/111 |
| 8,514,533 | B2* | 8/2013 | Mozak | H01L 27/0285 361/56 |
| 9,634,483 | B2* | 4/2017 | Huang | H02H 9/046 |

(Continued)

FOREIGN PATENT DOCUMENTS

| CN | 102136722 A | 7/2011 |
|---|---|---|
| CN | 102170118 A | 8/2011 |

(Continued)

*Primary Examiner* — Scott Bauer
(74) *Attorney, Agent, or Firm* — McDermott Will & Emery LLP

(57) ABSTRACT

A transient-triggered DC voltage-sustained power-rail ESD clamp circuit comprises: a transient-triggered module, a DC voltage-triggered module and a discharge device, wherein the transient-triggered module is connected with the DC voltage-triggered module and the discharge device respectively. When an ESD event is approaching, the ESD protection circuit can be turned on well and quickly, and can effectively avoid the problems of erroneous triggering and latching-up caused by quick power-on and high-frequency noise at the same time.

5 Claims, 5 Drawing Sheets

(56) References Cited

U.S. PATENT DOCUMENTS

| | | |
|---|---|---|
| 2006/0039093 A1 | 2/2006 | Gauthier, Jr. et al. |
| 2007/0188953 A1* | 8/2007 | Lee .................... H01L 27/0285 361/56 |
| 2009/0201615 A1* | 8/2009 | Bernard ................ H02H 9/046 361/56 |
| 2010/0149701 A1* | 6/2010 | Drapkin .............. H01L 27/0285 361/56 |
| 2012/0180008 A1* | 7/2012 | Gist, III ................... H02H 9/04 716/101 |
| 2013/0100561 A1* | 4/2013 | Senouci ................ H02H 9/046 361/56 |
| 2015/0214732 A1* | 7/2015 | Haruki .................. H02H 9/046 361/56 |

FOREIGN PATENT DOCUMENTS

| | | |
|---|---|---|
| CN | 102723702 A | 10/2012 |
| CN | 103248033 A | 8/2013 |

* cited by examiner

US 10,096,994 B2

TRANSIENT-TRIGGERED DC VOLTAGE-SUSTAINED POWER-RAIL ESD CLAMP CIRCUIT

TECHNICAL FIELD

The present invention relates to the technical field of integrated circuit chip electrostatic discharge (ESD) protection, and particularly to a transient-triggered DC voltage-sustained power-rail ESD clamp circuit.

BACKGROUND

Anti-electrostatic impact design of an integrated circuit chip is an essential guarantee on reliable working of the chip, and an effective ESD protection scheme requires a discharge device to rapidly enter a high-current discharge state when an ESD event is approaching, while keeping a turn-off state when the chip works normally. In an ESD protection design for the chip, a normal working voltage and an ESD event are generally differentiated through the amplitude and the rise time of a signal, and the ESD event has the characteristics of a very short rise time (in the order of a few hundred picoseconds to a few tens of nanoseconds) and a very high transient pulse amplitude. Whereas the power-up time of the normal working voltage is usually 4 to 5 orders longer than that of the ESD event, and the amplitude voltage of the normal working voltage is far lower than that of the ESD event.

The ESD protection design for the chip naturally involves the problem of a trigger mechanism for the discharge device. In a traditional device-level ESD protection design, a gate-grounded NMOS (N-mental-oxide-semiconductor) transistor is usually used as the discharge device, and when a pulse voltage applied to the drain terminal of the device is up to a certain extent, a parasitic BJT (bipolar junction transistor) device in the body of the NMOS transistor is turned on and enters a charge-discharge state. The trigger mechanism of this design scheme is a pure DC (direct current) trigger mechanism utilizing a parasitic current path in the body of the device, and whether the discharge device is turned on or not is completely determined by the amplitude of the voltage applied to the drain terminal regardless of the own rise time of the pulse. This trigger mechanism has the following characteristics: the design is simple and additional trigger circuit is not required, however, the turn-on of the discharge device is not quick enough and the discharge capacity is not high enough.

In order to solve the problems existed in the trigger mechanism above that the turn-on of the discharge device is not quick enough and the discharge capacity is not high enough, a designer usually uses an auxiliary circuit for carrying out transient identification on the ESD event, and whether an impact is the ESD event is judged by an RC detection circuit according to the rise time of a pulse, and if so, the gate electrode of the discharge device is pulled up so that a channel current participates in discharge of static charges. This trigger mechanism is pure transient trigger, and a typical circuit structure is shown in FIG. 1. A protection structure with the pure transient trigger mechanism has the advantage in that the turn-on time of the discharge device is very short when the ESD event is approaching, the discharge current is composed of both a current in the body of the discharge device and the channel current, thus a higher protection reliability is achieved relative to a gate-grounded protection scheme. However, the pure transient-triggered power-rail ESD clamp circuit is very sensitive to quick power-up and a high-frequency noise, and is prone to erroneous triggering phenomenon when the chip works normally. Meanwhile, as shown in FIG. 1, in order to enable discharge transistor to keep a turn-on state during the whole ESD event period, the designer will usually add an additional NMOS transistor $M_{fb}$ to form a positive feedback, and the pure transient-triggered protection circuit with the feedback mechanism further faces to a serious latching-up problem after erroneous triggering.

Another trigger mechanism for the discharge device is a circuit-assisted pure DC trigger mechanism, as shown in FIG. 2, the main idea of this pure DC trigger mechanism design lies in that: when the chip works normally, a relatively low voltage amplitude is applied to $V_{DD}$, a diode-connected NMOS transistor $M_{nc}$ clamps a voltage at its own drain terminal to a logic high level, and at this moment, the discharge device $M_{big}$ keeps a turn-off state. When the ESD event is approaching, the voltage applied to the $V_{DD}$ instantly achieves a very high amplitude, so that the voltage at the drain terminal of the $M_{nc}$ becomes a logic low state, and the discharge device is turned on through driving of a phase inverter so as to enter an ESD discharge mode. The circuit-assisted pure DC trigger mechanism has the following characteristics: firstly, a channel current and a volume current participate in charge discharge simultaneously, thus relatively high protection reliability is achieved. Secondly, the circuit-assisted pure DC trigger mechanism is insensitive to quick power-up and a high-frequency noise, and the problem of erroneous triggering during normal working can be substantially avoided as long as it is properly designed. However, the turn-on of the discharge device in the pure DC trigger mechanism is late, and the discharge device is turned on only after the voltage applied to $V_{DD}$ exceeds the trigger voltage thereof, while during the period from the ESD event rising to the trigger voltage of the discharge device from zero volt, the chip is still exposed to the ESD event, thus the reliability of the design scheme of the pure DC trigger mechanism is greatly reduced.

SUMMARY

(I) Technical Problem to Be Solved

The technical problem to be solved by the present invention is: how to effectively combine the pure transient-triggered mechanism with the pure DC-triggered mechanism while determining the transient and DC conditions of the ESD event, so that the discharge device can be turned on quickly when the ESD event is approaching and achieves a high discharge capacity, the discharge device is also insensitive to quick power-up and erroneous triggering, and the occurrence of a latching-up phenomenon is effectively avoided when the chip works normally.

(II) Technical Solution

In order to solve the technical problem above, the present invention provides a transient-triggered dc voltage-sustained power-rail ESD clamp circuit comprising a transient-triggered module, a DC voltage-triggered module and a discharge device;

the transient-triggered module is connected with the discharge device, and used for judging whether a obtained pulse meets transient judgement condition of an ESD event according to rise time of the pulse, and if so, then a first response signal is sent to the discharge device, and the first response signal is used for turning on the discharge device;

the DC voltage-triggered module is connected with the transient-triggered module, and used for judging whether the pulse meets the DC voltage judgement condition of the ESD event according to the amplitude value of the pulse, and if so, then a second response signal is sent to the transient-triggered module, and the transient-triggered module controls the discharge device to keep in a turn-on state according to the second response signal;

the discharge device is used for discharging static charges brought by the pulse.

Preferably, the transient-triggered module comprises:

a PMOS transistor $M_{p2}$, NMOS transistors $M_{n2}$ and $M_{fb2}$, a resistor $R_2$ and a capacitor C; a gate electrode of the PMOS transistor $M_pg$ is connected with that of the NMOS transistor $M_{n2}$, a source electrode of the NMOS transistor $M_{n2}$ is grounded, a drain electrode of the NMOS transistor $M_{n2}$ is connected with that of the PMOS transistor $M_{p2}$, a source electrode of the PMOS transistor $M_{p2}$ is connected with a power pin $V_{DD}$ of a transient-triggered DC voltage-sustained power-rail ESD clamp circuit, a source electrode of the NMOS transistor $M_{fb2}$ is grounded, a drain electrode of the NMOS transistor $M_{fb2}$ is connected with a gate electrode of the PMOS transistor $M_{p2}$, one end of the resistor $R_2$ is connected with the power pin $V_{DD}$ of the transient-triggered DC voltage-sustained power-rail ESD clamp circuit, the other end of the resistor $R_2$ is connected with the gate electrode of the PMOS transistor $M_{p2}$, one end of the capacitor C is connected with the gate electrode of the PMOS transistor $M_{p2}$, and the other end of the capacitor C is grounded.

Preferably, the DC voltage-triggered module comprises:

a PMOS transistor $M_{p1}$, NMOS transistors $M_{n1}$, $M_{fb1}$ and $M_{nc}$, and a resistor $R_1$; the gate electrode of the PMOS transistor $M_{p1}$ is connected with that of the NMOS transistor $M_{n1}$, a source electrode of the NMOS transistor $M_{n1}$ is grounded, the drain electrode of the NMOS transistor $M_{n1}$ is connected with that of the PMOS transistor $M_{p1}$, a source electrode of the PMOS transistor $M_{p1}$ is connected with the power pin $V_{DD}$ of the transient-triggered DC voltage-sustained power-rail ESD clamp circuit, a gate electrode of the NMOS transistor $M_{fb1}$ is connected with the drain electrode of the PMOS transistor $M_{p1}$, a gate electrode of the NMOS transistor $M_{fb1}$ is also connected with that of the NMOS transistor $M_{fb2}$, a source electrode of the NMOS transistor $M_{fb1}$ is grounded, a drain electrode of the NMOS transistor $M_{fb1}$ is connected with the gate electrode of the PMOS transistor $M_{p1}$, the gate electrode of the NMOS transistor $M_{nc}$ is connected with the gate electrode of the PMOS transistor $M_{p1}$, a source electrode of the NMOS transistor $M_{nc}$ is grounded, a drain electrode of the NMOS transistor $M_{nc}$ is connected with the gate electrode thereof, one end of the resistor $R_1$ is connected with the power pin $V_{DD}$ of the transient-triggered DC voltage-sustained power-rail ESD clamp circuit, and the other end of the resistor $R_1$ is connected with the gate electrode of the NMOS transistor $M_{nc}$.

Preferably, the discharge device 3 is an NMOS transistor $M_{big}$, the gate electrode of the NMOS transistor $M_{big}$ is connected with the drain electrode of the PMOS transistor $M_{p2}$, the source electrode of the NMOS transistor $M_{big}$ is grounded, and the drain electrode of the NMOS transistor $M_{big}$ is connected with the power pin $V_{DD}$ of the transient-triggered DC voltage-sustained power-rail ESD clamp circuit.

(III) Beneficial Effects

According to the transient-triggered DC voltage-sustained power-rail ESD clamp circuit provided by the embodiments of the present invention, the discharge device is turned on by the transient-triggered module, and the conduction of the discharge device is maintained by the DC-triggered module, so that the discharge device is triggered by the transient judgement condition of the ESD event. When the ESD event is approaching, the discharge device can be turned on well and quickly. Meanwhile, the turn-on state of the discharge device is maintained by the DC judgement condition of the ESD event, thus the problems of erroneous triggering and latching-up caused by quick power-up and the high-frequency noise is avoided effectively.

DETAILED DESCRIPTION OF THE PREFERRED EMBODIMENTS

The specific embodiments of the present invention are further described below in details in conjunction with the accompanying drawings and examples. The examples below are used for illustrating the present invention but are not intended to limit the scope of the present invention.

The core idea of the present invention is as follows: a discharge device is turned on by a transient-triggered module, and the conduction of the discharge device is maintained by a DC-triggered module; and in the circuit disclosed by the present invention, the discharge device is quickly triggered by virtue of the transient judgement condition of the ESD event, and then the conduction state of the discharge device is maintained by virtue of the DC judgement condition of the ESD event, and maintenance of the conduction state of the discharge device with its own conduction state as a feedback condition is avoided, thus the latching-up problem which may be encountered when the chip works normally can be effectively avoided, meanwhile, combination of the transient judgement condition of the ESD event and the DC judgement condition of the ESD event equivalently adds a voltage recovery circuit to the output voltage of the DC judgement condition of the ESD event, so that the discharge device can be turned on more quickly and better when the ESD event is approaching.

Figure 3:
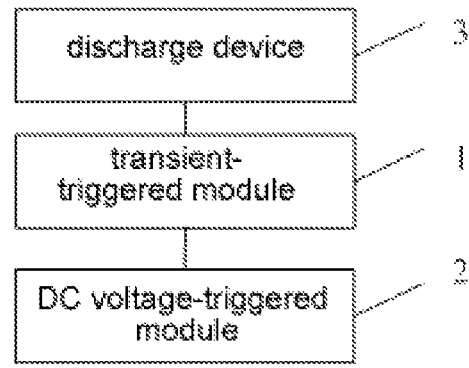
FIG. 3 is a structural diagram of a transient-triggered DC voltage-sustained power-rail ESD clamp circuit according to one embodiment of the present invention.

FIG. 3 is a structural diagram of transient-triggered DC voltage-sustained power-rail ESD clamp circuit according to one embodiment of the present invention, comprising: a transient-triggered module 1, a DC voltage-triggered module 2 and a discharge device 3;

the transient-triggered module 1 is connected with the discharge device 3, and used for judging whether the obtained pulse meets the transient judgement condition of an ESD event according to the rise time of the pulse, and if so, then a first response signal is sent to the discharge device 3, and the first response signal is used for turning on the discharge device 3;

the DC voltage-triggered module 2 is connected with the transient-triggered module 1, and used for judging whether the pulse meets the DC voltage judgement condition of the ESD event according to the amplitude value of the pulse, and if so, then a second response signal is sent to the transient-triggered module 1, and the transient-triggered module 1 controls the discharge device 3 to keep in a turn-on state according to the second response signal;

the discharge device 3 is used for discharging static charges brought by the pulse.

Figure 4:
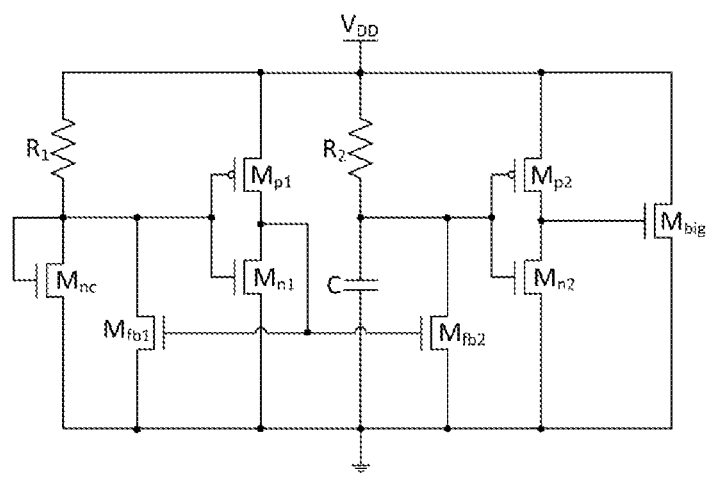
FIG. 4 is a structural schematic diagram of a transient-triggered DC voltage-sustained power-rail ESD clamp circuit according to one embodiment of the present invention.

FIG. 4 is a structural schematic diagram of the transient-triggered DC voltage-sustained power-rail ESD clamp circuit according to one embodiment of the present invention. The transient-triggered module 1 comprises: a PMOS transistor $M_{p2}$, NMOS transistors $M_{n2}$ and $M_{fb2}$, a resistor $R_2$ and a capacitor C. A gate electrode of the PMOS transistor $M_{p2}$ is connected with that of the NMOS transistor $M_{n2}$, a source electrode of the NMOS transistor $M_{n2}$ is grounded, a drain electrode of the NMOS transistor $M_{n2}$ is connected with that of the PMOS transistor $M_{p2}$, a source electrode of the PMOS transistor $M_{p2}$ is connected with a power pin $V_{DD}$ of the transient-triggered DC voltage-sustained power-rail ESD clamp circuit, a source electrode of the NMOS transistor $M_{fb2}$ is grounded, a drain electrode of the NMOS transistor $M_{fb2}$ is connected with the gate electrode of the PMOS transistor $M_{p2}$, one end of the resistor $R_2$ is connected with the power pin $V_{DD}$ of the transient-triggered DC voltage-sustained power-rail ESD clamp circuit, the other end of the resistor $R_2$ is connected with the gate electrode of the PMOS transistor $M_{p2}$, one end of the capacitor C is connected with the gate electrode of the PMOS transistor $M_{p2}$, and the other end of the capacitor C is grounded.

The DC voltage-triggered module 2 comprises: a PMOS transistor $M_{p1}$, NMOS transistors $M_{n1}$, $M_{fb1}$ and $M_{nc}$, and a resistor $R_1$. A gate electrode of the PMOS transistor $M_{p1}$ is connected with that of the NMOS transistor $M_{n1}$, a source electrode of the NMOS transistor $M_{n1}$ is grounded, a drain electrode of the NMOS transistor $M_{n1}$ is connected with that of the PMOS transistor $M_{p1}$, a source electrode of the PMOS transistor $M_{p1}$ is connected with the power pin $V_{DD}$ of the transient-triggered DC voltage-sustained power-rail ESD clamp circuit, a gate electrode of the NMOS transistor $M_{fb1}$ is connected with a drain electrode of the PMOS transistor $M_{p1}$, the gate electrode of the NMOS transistor $M_{fb1}$ is also connected with that of the NMOS transistor $M_{fb2}$, a source electrode of the NMOS transistor $M_{fb1}$ is grounded, a drain electrode of the NMOS transistor $M_{fb1}$ is connected with the gate electrode of the PMOS transistor $M_{p1}$, a gate electrode of the NMOS transistor $M_{nc}$ is connected with the gate electrode of the PMOS transistor $M_{p1}$, a source electrode of the NMOS transistor $M_{nc}$ is grounded, a drain electrode of the NMOS transistor $M_{nc}$ is connected with the gate electrode thereof, one end of the resistor $R_1$ is connected with the power pin $V_{DD}$ of transient-triggered DC voltage-sustained power-rail ESD clamp circuit, and the other end of the resistor $R_1$ is connected with the gate electrode of the NMOS transistor $M_{nc}$.

The discharge device 3 is an NMOS transistor $M_{big}$, the gate electrode of the NMOS transistor $M_{big}$ is connected with the drain electrode of the PMOS transistor $M_{p2}$, the source electrode of the NMOS transistor $M_{big}$ is grounded, and the drain electrode of the NMOS transistor $M_{big}$ is connected with the power pin $V_{DD}$ of transient-triggered DC voltage-sustained power-rail ESD clamp circuit.

In the embodiment, the transient-triggered module is used for judging whether the pulse meets the transient judgement condition of the ESD event according to the rise time of the pulse, and if so, then a first response signal is sent to quickly turn on the discharge device; the DC voltage-triggered module is used for judging whether the pulse meets the DC voltage judgement condition of the ESD event according to the amplitude value of the pulse, and if so, then a second response signal is sent to a feedback transistor in the transient-triggered module, so that the discharge device is always in the turn-on state during the whole period of the ESD event, thus the discharge transistor enters a discharge state according to the response signals sent by the transient-triggered module and the DC voltage-triggered module when the ESD event is approaching, so as to effectively discharge the static charges brought by the ESD event and prevent the chip from being damaged.

Figure 2:
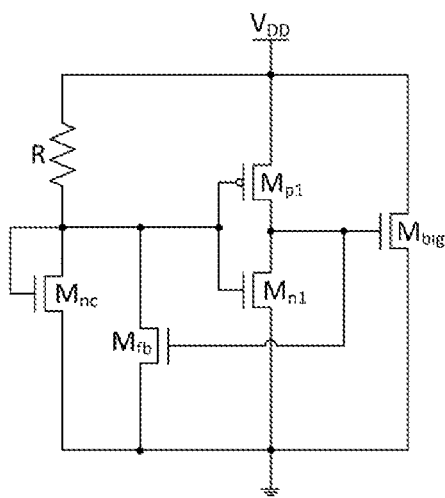
FIG. 2 is a structural schematic diagram of a circuit-assisted pure DC-triggered power-rail ESD clamp circuit in the prior art.

According to the transient-triggered DC voltage-sustained power-rail ESD clamp circuit of the embodiment, the discharge device is quickly triggered by virtue of the transient judgement condition, and then the conduction state of the discharge device is maintained by virtue of the DC judgement condition, which is different from maintenance of the conduction state of the discharge device with its own conduction state as a feedback condition in the circuit shown in FIG. 2. Therefore, the latching-up problem which may be encountered by the circuit shown in FIG. 2 when the chip works normally can be effectively avoided by the circuit structure disclosed by the present invention, meanwhile, the transient judgement condition is combined with the DC judgement condition through the NMOS transistor $M_{fb2}$ in the embodiment, and a voltage recovery circuit is added equivalently to the output voltage of the DC judgement condition, so that the discharge device is turned on more quickly and better when the ESD event is approaching.

Figure 1:
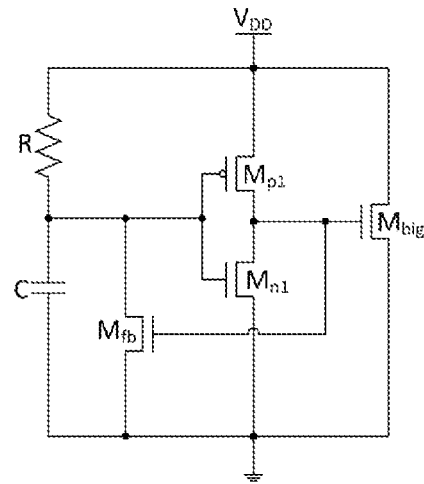
FIG. 1 is a structural schematic diagram of a pure transient-triggered power-rail ESD clamp circuit in the prior art.
Figure 5:
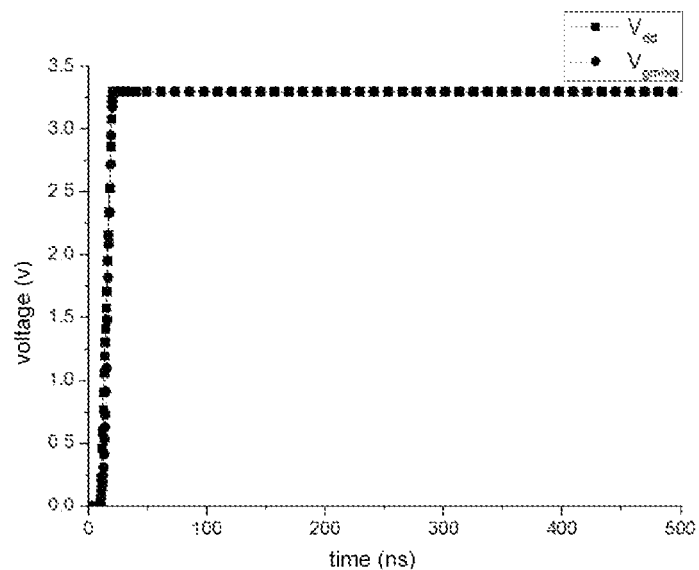
FIG. 5 is a schematic diagram of the changes of the voltage ($V_{dd}$) of a power pin $V_{DD}$ and the gate voltage ($V_{gmbg}$) of $M_{big}$ with time when a low-voltage and high-frequency noise occurs on the power pin $V_{DD}$ in the circuit shown in FIG. 1.

FIG. 5 shows the gate voltage of the discharge device $M_{big}$ with time when a high-frequency and low-amplitude noise occurs on the power pin $V_{DD}$ of the circuit shown in FIG. 1. During simulation, a pulse with an amplitude of 3.3V and a rise time of 10 ns is used for simulating such a noise, and it can be seen that: at this moment, the gate voltage of the discharge device substantially completely follows the changes of the power voltage, that is to say, the discharge device will enter a latching-up state influenced by the high-frequency noise with such a low amplitude, which is a phenomenon undesirable to the ESD designer.

Because the pure transient trigger mechanism is only used for determining the rise time of the pulse, there is a risk of latching-up of the discharge device caused by erroneous triggered by the high-frequency and low-voltage noise. According to the present invention, such a brand-new design conception of turning on the discharge device through transient trigger and maintaining the conduction of the discharge device through DC trigger is introduced on the basis of the problem. Under such a design conception, when the transient and DC judgement conditions of the ESD event are both met, the discharge device keeps the turn-on state thereof by virtue of the DC judgement condition of the ESD event, so that the RC time constant of the transient-triggered module is independent from the conduction time of the discharge device under the impact. In this way, the RC time constant may be set to be very small, so as to reduce the chip area occupied by the protection circuit and reduce the probability of responding to the high-frequency noise by the RC detection structure.

Figure 6:
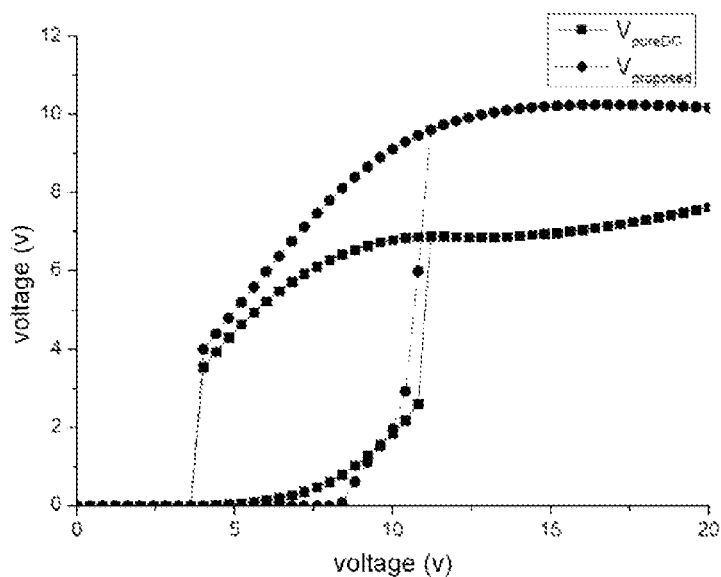
FIG. 6 is DC hysteresis scanning characteristic curves of the changes of the gate voltage ($V_{pureDC}$) of $M_{big}$ in the circuit shown in FIG. 2 and the gate voltage ($V_{proposed}$) of $M_{big}$ in the circuit shown in FIG. 4 with the voltage of the power pin $V_{DD}$.

FIG. 6 is DC hysteresis scanning characteristic curves of the changes of the gate voltage ($V_{pureDC}$) of $M_{big}$ in the circuit shown in FIG. 2 and the gate voltage ($V_{proposed}$) of $M_{big}$ in the circuit shown in FIG. 4 with the voltage of the power pin $V_{DD}$. It can be seen that: from a perspective of direct current, the circuit structure disclosed by the present invention is equivalent to adding a voltage recovery circuit on the basis of the output voltage of the phase inverter of the circuit shown in FIG. 2. Therefore, the circuit structure disclosed by the present invention has a lower turn-on voltage, and the discharge device has a higher gate voltage after turn-on, relative to the pure DC-triggered power-rail ESD clamp circuit shown in FIG. 2.

Figure 7:
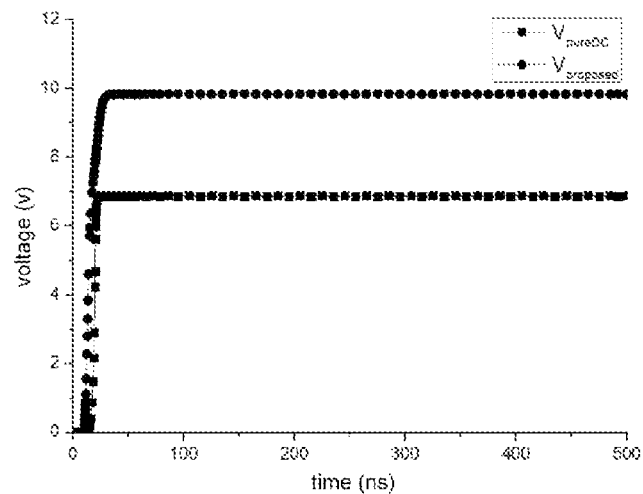
FIG. 7 is a schematic diagram of the changes of the gate voltage ($V_{PurDC}$) of $M_{big}$ in the circuit shown in FIG. 2 and the gate voltage ($V_{proposed}$) of $M_{big}$ in the circuit shown in FIG. 4 with time under an ESD event.

Once the transient and DC judgement conditions of the ESD are met, the gate voltage of the discharge device of the circuit structure disclosed by the present invention will be clamped until reaching the level of the power pin $V_{DD}$, and at this moment, the turn-off of the discharge device is not determined by a transient factor, and instead, the amplitude of the voltage on the power pin $V_{DD}$ is reduced with the discharge of the static charges. When the voltage on the power pin $V_{DD}$ is reduced to a certain extent, the gate voltage of the PMOS transistor $M_{p1}$ of the circuit shown in FIG. 4 become a logic high level. The discharge device is turned off through a two-stage phase inverter and the NMOS transistor $M_{fb2}$ behind the PMOS transistor $M_{p1}$, and the NMOS transistor $M_{fb1}$ has the function of enabling the DC turn-off voltage of the discharge device to be less than the trigger voltage of the DC-triggered module. In this way, the static charges can be more thoroughly discharged, meanwhile, the DC turn-off voltage of the discharge device should be greater than a power voltage during normal working, so as to prevent a steady-state latching-up phenomenon. It is easy to see from FIG. 6 that the circuit structure disclosed by the present invention meets the condition that the DC turn-off voltage is greater than the power voltage (3.3V) during normal working FIG. 7 is a schematic diagram of the changes of the gate voltage ($V_{PurDC}$) of $M_{big}$ in the circuit shown in FIG. 2 and the gate voltage ($V_{proposed}$) of $M_{big}$ in the circuit shown in FIG. 4 with time under an ESD event. After the transient and DC judgement conditions of the ESD event are both met, the gate voltage of the discharge device of the circuit structure disclosed by the present invention will be clamped to a high level, and the turn-off thereof is determined by the drop of a voltage on a power wire to the voltage level of a DC turn-off point. It can be seen from FIG. 7 that: because the discharge transistors are turned on by virtue of transient trigger in the circuit structure disclosed by the present invention, the discharge transistors in the present invention are turned on more quickly than those in the pure DC trigger type protection circuit when the ESD event is approaching. Meanwhile, from a perspective of pure direct current, the circuit structure disclosed by the present invention is equivalent to adding a voltage recovery circuit to the drive signal of the discharge device shown in FIG. 2. Therefore, in the circuit structure disclosed by the present invention, under the ESD event, the discharge transistors have higher gate voltages than those of the circuit structure shown in FIG. 2.

Figure 8:
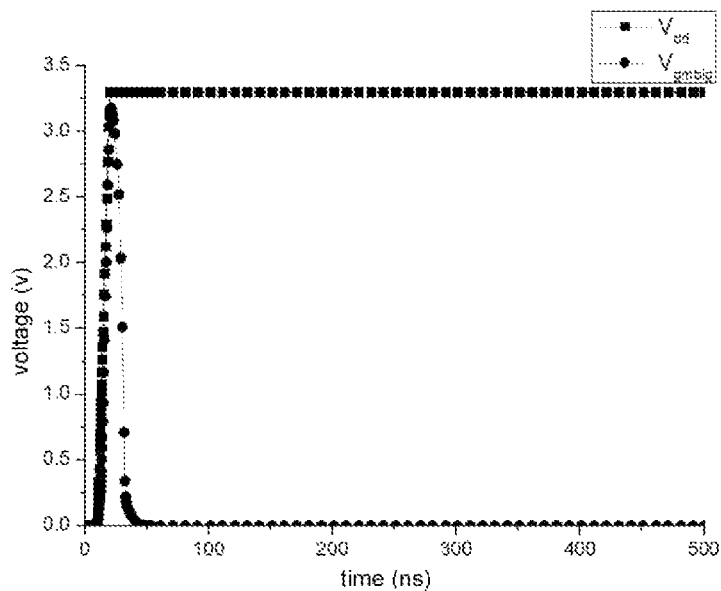
FIG. 8 is a schematic diagram of the changes of the voltage ($V_{dd}$) of the power pin $V_{DD}$ and the gate voltage ($V_{gmbg}$) of $M_{big}$ with time when a low-voltage and high-frequency noise occurs on the power pin $V_{DD}$ in the circuit shown in FIG. 4.

FIG. 8 simulates the change of the gate voltage ($V_{gmbg}$) of the discharge device for the circuit structure disclosed by the present invention with time, under a high-frequency low-voltage noise with a rise time of 10 ns and a pulse amplitude of 3.3V. It can be seen from FIG. 8 that: the discharge device has a short response to such a high-frequency noise, but the latching-up phenomenon shown in FIG. 5 does not occur. This is because the turn-on state of the discharge device of the circuit disclosed by the present invention is maintained by the DC judgement condition, and although the rise time of the high-frequency noise meets the transient judgement condition of the ESD event, the rise time does not meet the DC judgement condition. Therefore, the discharge device has the response time only determined by the RC time constant. During the design phase, the transient RC time constant can be set to be low, in this way, a layout area can be saved, and the response time to the high-frequency noise can be shortened at the same time.

Figure 9:
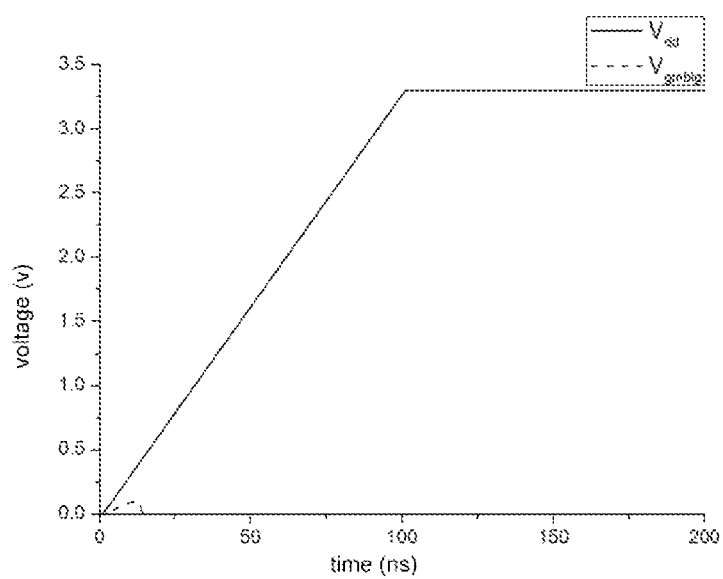
FIG. 9 is a schematic diagram of the changes of the voltage ($V_{dd}$) of the power pin $V_{DD}$ and the gate voltage ($V_{gmbg}$) of $M_{big}$ with time when the chip is normally powered up in the circuit shown in FIG. 4.

FIG. 9 shows the changes of the gate voltages of the discharge transistors with time when the circuit structure disclosed by the present invention is normally powered up. It can be seen from FIG. 9 that: the gate voltages of the discharge transistors are very low at this moment, and the corresponding leak currents are also very low, which will meet the design requirements of the power clamp ESD protection circuit.

According to the transient-triggered DC voltage-sustained power-rail ESD clamp circuit provided by the embodiments of the present invention, the discharge device is turned on by the transient-triggered module, and the conduction of the discharge device is maintained by the DC-triggered module, so that the discharge device is triggered by the transient judgement condition of the ESD event. When the ESD event is approaching, the discharge device can be turned on well and quickly. Meanwhile, the turn-on state of the discharge device is maintained by the DC judgement condition of the ESD event, thus the problems of erroneous triggering and latching-up caused by quick power-up and the high-frequency noise is avoided effectively.

The foregoing embodiments above are merely used for illustrating instead of limiting the present invention, and various modifications and variations could be made by those skilled in the art without departing from the spirit and scope of the present disclosure. Therefore, all equivalent technical solutions also fall into the scope of the present invention, and the protection scope of the present invention should be defined by claims.

The invention claimed is:
1. A transient-triggered DC voltage-sustained power-rail ESD clamp circuit, comprising: a transient-triggered module, a DC voltage-triggered module and a discharge device, wherein
the transient-triggered module is directly connected with a gate terminal of the discharge device, and operable for judging whether an obtained pulse meets transient judgement condition of an ESD event according to rise time of the obtained pulse, and if so, then sending a first response signal to the discharge device, wherein the first response signal is for turning on the discharge device;

the DC voltage-triggered module is connected with the transient-triggered module, and operable for judging whether the obtained pulse meets DC voltage judgement condition of the ESD event according to amplitude of the obtained pulse, and if so, then sending a second response signal to the transient-triggered module, wherein the transient-triggered module is operable for controlling the discharge device to keep in a turn-on state according to the second response signal; and the discharge device is operable for discharging static charges brought by the obtained pulse.

2. The transient-triggered DC voltage-sustained power-rail ESD clamp circuit according to claim 1, wherein the transient-triggered module comprises: a PMOS transistor $M_{p2}$, NMOS transistors $M_{n2}$ and $M_{fb2}$, a resistor $R_2$ and a capacitor C, wherein a gate electrode of the PMOS transistor $M_{p2}$ is connected with a gate electrode of the NMOS transistor $M_{n2}$, a source electrode of the NMOS transistor $M_{n2}$ is grounded, a drain electrode of the NMOS transistor $M_{n2}$ is connected with a drain electrode of the PMOS transistor $M_{p2}$, a source electrode of the PMOS transistor $M_{p2}$ is connected with a power pin $V_{DD}$ of the transient-triggered DC voltage-sustained power-rail ESD clamp circuit, a source electrode of the NMOS transistor $M_{fb2}$ is grounded, a drain electrode of the NMOS transistor $M_{fb2}$ is connected with a gate electrode of the PMOS transistor $M_{p2}$, one end of the resistor $R_2$ is connected with a power pin $V_{DD}$ of transient-triggered DC voltage-sustained power-rail ESD clamp circuit, another end of the resistor $R_2$ is connected with the gate electrode of the PMOS transistor $M_{p2}$, one end of the capacitor C is connected with the gate electrode of the PMOS transistor $M_{p2}$, and the other end of the capacitor C is grounded.

3. The transient-triggered DC voltage-sustained power-rail ESD clamp circuit according to claim 2, wherein the DC voltage-triggered module comprises: a PMOS transistor $M_{p1}$, NMOS transistors $M_{n1}$ and $M_{nc}$, and a resistor $R_1$, wherein a gate electrode of the PMOS transistor $M_{p1}$ is connected with a gate electrode of the NMOS transistor $M_{n1}$, a source electrode of the NMOS transistor $M_{n1}$ is grounded, a drain electrode of the NMOS transistor $M_{n1}$ is connected with a drain electrode of the PMOS transistor $M_{p1}$, a source electrode of the PMOS transistor $M_{p1}$ is connected with the power pin $V_{DD}$ of the transient-triggered DC voltage-sustained power-rail ESD clamp circuit, a gate electrode of the NMOS transistor $M_{fb1}$ is connected with the drain electrode of the PMOS transistor $M_{p1}$, the gate electrode of the NMOS transistor $M_{fb1}$ is also connected with the gate electrode of the NMOS transistor $M_{fb2}$, the source electrode of the NMOS transistor $M_{fb1}$ is grounded, a drain electrode of the NMOS transistor $M_{fb1}$ is connected with a gate electrode of the PMOS transistor $M_{p1}$, a gate electrode of the NMOS transistor $M_{nc}$, is connected with the gate electrode of the PMOS transistor $M_{p1}$, a source electrode of the NMOS transistor $M_{nc}$ is grounded, a drain electrode of the NMOS transistor $M_{nc}$, is connected with the gate electrode thereof, one end of the resistor $R_1$ is connected with the power pin $V_{DD}$ of the transient-triggered DC voltage-sustained power-rail ESD clamp circuit, and another end of the resistor $R_1$ is connected with the gate electrode of the NMOS transistor $M_{nc}$.

4. The transient-triggered DC voltage-sustained power-rail ESD clamp circuit according to claim 2, wherein the discharge device is an NMOS transistor $M_{big}$, the gate electrode of the NMOS transistor $M_{big}$ is connected with the drain electrode of the PMOS transistor $M_{p2}$, the source electrode of the NMOS transistor $M_{big}$ is grounded, and the drain electrode of the NMOS transistor $M_{big}$ is connected with the power pin $V_{DD}$ of the transient-triggered DC voltage-sustained power-rail ESD clamp circuit.

5. The transient-triggered DC voltage-sustained power-rail ESD clamp circuit according to claim 3, wherein the discharge device is an NMOS transistor $M_{big}$, the gate electrode of the NMOS transistor $M_{big}$ is connected with the drain electrode of the PMOS transistor $M_{p2}$, the source electrode of the NMOS transistor $M_{big}$ is grounded, and the drain electrode of the NMOS transistor $M_{big}$ is connected with the power pin $V_{DD}$ of the transient-triggered DC voltage-sustained power-rail ESD clamp circuit.

\* \* \* \* \*